(12) United States Patent
Ajima

(10) Patent No.: US 9,281,782 B2
(45) Date of Patent: Mar. 8, 2016

(54) TRANSMITTER AND SIGNAL PROCESSING METHOD

(75) Inventor: Hiromi Ajima, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 97 days.

(21) Appl. No.: 14/123,484

(22) PCT Filed: May 31, 2012

(86) PCT No.: PCT/JP2012/003609
§ 371 (c)(1),
(2), (4) Date: Dec. 2, 2013

(87) PCT Pub. No.: WO2012/164951
PCT Pub. Date: Dec. 6, 2012

(65) Prior Publication Data
US 2014/0097893 A1    Apr. 10, 2014

(30) Foreign Application Priority Data

Jun. 3, 2011   (JP) .................. 2011-125164

(51) Int. Cl.
| | |
|---|---|
| H03G 3/20 | (2006.01) |
| H03F 1/02 | (2006.01) |
| H03F 3/189 | (2006.01) |
| H03F 3/24 | (2006.01) |
| H04B 1/04 | (2006.01) |

(52) U.S. Cl.
CPC .................. *H03F 1/02* (2013.01); *H03F 1/025* (2013.01); *H03F 3/189* (2013.01); *H03F 3/24* (2013.01); *H03F 3/245* (2013.01); *H04B 1/0475* (2013.01); *H03F 2200/102* (2013.01); *H03F 2200/336* (2013.01); *H03F 2200/555* (2013.01)

(58) Field of Classification Search
CPC ............................ H03F 1/0222; H03F 1/025
USPC ................................. 330/136, 280
See application file for complete search history.

(56) References Cited

U.S. PATENT DOCUMENTS 8,159,297 B2 *  4/2012  Kumagai ............... 330/149
2005/0079835 A1   4/2005  Takabayashi et al.
(Continued)

FOREIGN PATENT DOCUMENTS

| JP | 2004-128933 A | 4/2004 |
|---|---|---|
| JP | 2004-289812 A | 10/2004 |

(Continued)

OTHER PUBLICATIONS

International Search Report; PCT/JP2012/003609; Aug. 7, 2012.
(Continued)

*Primary Examiner* — Steven J Mottola
(74) *Attorney, Agent, or Firm* — Studebaker & Brackett PC

(57) ABSTRACT

The switching frequency in an envelope amplifier is set below that of a transmission RF signal. A transmitter according to the present invention includes a transmission amplifier (3) that amplifies an input signal and generates an output signal, a voltage control amplifier (6) that controls a power supply voltage of the transmission amplifier (3), and an envelope calculation unit (4) that calculates an approximate envelope signal that is an envelope signal of the input signal and is sampled at a lower frequency than the input signal. The voltage control amplifier (6) controls the power supply voltage of the transmission amplifier (3) based on the approximate envelope signal.

5 Claims, 9 Drawing Sheets

(56) References Cited

U.S. PATENT DOCUMENTS

| | | |
|---|---|---|
| 2006/0046666 A1 | 3/2006 | Hara et al. |
| 2006/0111057 A1 | 5/2006 | Akizuki et al. |
| 2009/0156142 A1 | 6/2009 | Matsuura |
| 2009/0191923 A1 | 7/2009 | Fudaba et al. |

FOREIGN PATENT DOCUMENTS

| | | |
|---|---|---|
| JP | 2005-117315 A | 4/2005 |
| JP | 2006-148835 A | 6/2006 |
| JP | 2009-147494 A | 7/2009 |
| JP | 2009-177640 A | 8/2009 |
| JP | 2011-101111 A | 5/2011 |

OTHER PUBLICATIONS

An Office Action; "Notice of Reasons for Rejection," issued by the Japanese Patent Office on Jun. 10, 2014, which corresponds to Japanese Patent Application No. 2013-517889 and is related to U.S. Appl. No. 14/123,484; with English language concise explanation.

* cited by examiner

TRANSMITTER AND SIGNAL PROCESSING METHOD

CROSS-REFERENCE TO RELATED APPLICATION

This application claims priority to and the benefit of Japanese Patent Application No. 2011-125164 filed Jun. 3, 2011, the entire contents of which are incorporated herein by reference.

TECHNICAL FIELD

The present invention relates to a transmitter and to a signal processing method.

BACKGROUND

For radio communication terminals such as cellular phones and for radio transmitters such as mobile communication base stations, there is demand for amplifiers with excellent power saving characteristics and little distortion. In general, in order to satisfy distortion properties, the transmission RF power amplifier in a transmitter is used at an output level having good linearity and sufficient back-off from saturation power. As a result, however, the transmission RF power amplifier is used in a state of poor power efficiency, thereby increasing power consumption and leading to an increase in size of the transmitter. A variety of techniques have therefore been proposed for improving the efficiency of a transmission RF power amplifier, such as Doherty amplifiers and Envelope Tracking amplifiers (for example, see Patent Literature 1-3 and Non-Patent Literature 1 and 2).

FIG. 7 illustrates the circuit configuration of an analog ET amplifier, and FIG. 8 illustrates the circuit configuration of a digital ET amplifier. With ET, an input signal is divided in two, with one input signal being input into a detection circuit so that only the amplitude signal component (envelope signal) is extracted. An amplifier that controls the power supply voltage of the transmission RF power amplifier (referred to below as "envelope amplifier") controls the power supply voltage of the transmission RF power amplifier with a voltage proportional to the envelope signal. Via a limiting circuit, the other input signal becomes a high-frequency signal with only the phase signal component, and the transmission RF power amplifier can output a transmission RF signal that includes the original envelope by amplifying the high-frequency signal at the power supply voltage provided by the envelope amplifier.

The definition for the efficiency of the transmission RF power amplifier is generally given by Equation 1. In this equation, $V_{out}$ represents the output voltage, $I_{out}$ represents the output current, $V_{dd}$ represents the supply voltage (power supply voltage), and $I_{dd}$ represents the supply current.

$$\text{efficiency} = V_{out} \times I_{out} / V_{dd} \times I_{dd} \quad (1)$$

Equation 1 above demonstrates that if $V_{dd}$, which is the power supply voltage, is varied to be lower than a fixed power supply voltage, the efficiency can be improved as compared to the fixed power supply voltage. In particular, as described above an ET amplifier can improve amplifier efficiency since the power supply voltage supplied to the transmission RF power amplifier from the envelope amplifier changes in response to the envelope signal.

FIG. 9 illustrates the circuit configuration of an ET envelope amplifier. Note that in FIG. 9, the transmission RF power amplifier is illustrated with an equivalent load $R_{load}$. The input signal into the envelope amplifier is first added to a voltage follower amplifier, and current flows to the load $R_{load}$ through the load $R_{sense}$. Meanwhile, a comparator (hysteresis width h) operates due to the voltage generated at either end of the load $R_{sense}$, and when a MOS-FET turns ON, current flows to the load $R_{load}$ from a coil L. As a result, the voltage at the load $R_{load}$ side of the load $R_{sense}$ rises, so that the comparator inverts and the MOS-FET turns OFF. Such a circuit transmits of its own accord and generates a PWM signal.

In an ET envelope amplifier, a semiconductor device such as a MOS-FET is used as a switch as described above. For example, according to Non-patent Literature 1, when a 20 MHz OFDM signal is assumed, a switching frequency of 100 MHz is necessary in order to reproduce a detailed envelope.

CITATION LIST

Patent Literature 1: JP2005117315A
Patent Literature 2: JP2004289812A
Patent Literature 3: JP2006148835A
Non-patent Literature 1: Miyazaki S. et al., "Development of fundamental technology for improved efficiency of transmission power amplifiers for mobile communication base stations", Shimada Rika Giho, No. 20, pp. 30-33, 2008.
Non-patent Literature 2: Kanbe, A. et al, "New Architecture of Envelope Tracking Power Amplifier for Base Station", $21^{st}$ Workshop on Circuits and Systems, 2008.

SUMMARY

When the switching frequency is high, roughly several times that of the transmission RF signal, the constraints on the rising/lowering time of the switching signal become severe, making it difficult to use a universal device as the switching device. Furthermore, when the switching frequency is approximately equal to that of the transmission RF signal, the problem of an increase in the power consumption by the gate driver of the semiconductor device remains.

The present invention has been conceived in light of the above considerations and provides a transmitter and a signal processing method that can improve the efficiency of a transmission RF power amplifier while reducing the switching frequency in an envelope amplifier to be below that of the transmission RF signal.

In order to resolve the above problems, a transmitter according to the present invention includes a transmission amplifier configured to amplify an input signal and generate an output signal; a voltage control amplifier configured to control a power supply voltage of the transmission amplifier; and an envelope calculation unit configured to calculate an approximate envelope signal that is an envelope signal of the input signal and is sampled at a lower frequency than the input signal. The voltage control amplifier controls the power supply voltage of the transmission amplifier based on the approximate envelope signal.

The transmitter according to the present invention preferably further includes a delay correction unit configured to perform delay correction on the input signal so that the input signal and the approximate envelope signal are aligned in phase and to provide the input signal after the delay correction to the transmission amplifier.

The transmitter according to the present invention preferably further includes an envelope detection unit configured to detect an output envelope signal of the output signal from the transmission amplifier; a delay amplitude comparison unit configured to perform an amplitude and phase comparison between the output envelope signal and the approximate envelope signal; and an amplitude phase correction unit configured to correct, based on the amplitude and phase comparison, amplitude and phase of the approximate envelope signal so that the input signal and the power supply voltage are aligned in phase in the transmission amplifier and to provide the delay to the delay amplitude comparison unit. The delay correction unit preferably performs the delay correction on the input signal using the delay provided by the amplitude phase correction unit.

In order to resolve the above problems, a signal processing method for a transmitter according to the present invention includes amplifying an input signal and generating an output signal with a transmission amplifier; controlling a power supply voltage of the transmission amplifier with a voltage control amplifier; calculating an approximate envelope signal with an envelope calculation unit, the approximate envelope signal being an envelope signal of the input signal and being sampled at a lower frequency than the input signal; performing, with a delay correction unit, delay correction on the input signal so that the input signal and the approximate envelope signal are aligned in phase and providing the input signal after the delay correction to the transmission amplifier; and controlling the power supply voltage of the transmission amplifier with the voltage control amplifier based on the approximate envelope signal.

The signal processing method according to the present invention preferably further includes detecting an output envelope signal of the output signal from the transmission amplifier with an envelope detection unit; performing an amplitude and phase comparison between the output envelope signal and the approximate envelope signal with a delay amplitude comparison unit; calculating a delay from the phase comparison; correcting, with an amplitude phase correction unit, amplitude and phase of the approximate envelope signal based on the delay so that the input signal and the power supply voltage are aligned in phase in the transmission amplifier and providing the delay to the delay amplitude comparison unit; and performing, with the delay correction unit, the delay correction on the input signal using the delay provided by the amplitude phase correction unit.

According to the transmitter and the signal processing method of the present invention, the efficiency of the transmission RF power amplifier can be increased, and the switching frequency in the envelope amplifier can be set below that of the transmission RF signal. The choice of switching devices can therefore be widened, and the power consumption for switching can be reduced.

BRIEF DESCRIPTION OF DRAWINGS

The present invention will be further described below with reference to the accompanying drawings, wherein.

DESCRIPTION OF EMBODIMENTS

The following describes an embodiment of the present invention in detail with reference to the drawings.

Figure 1:
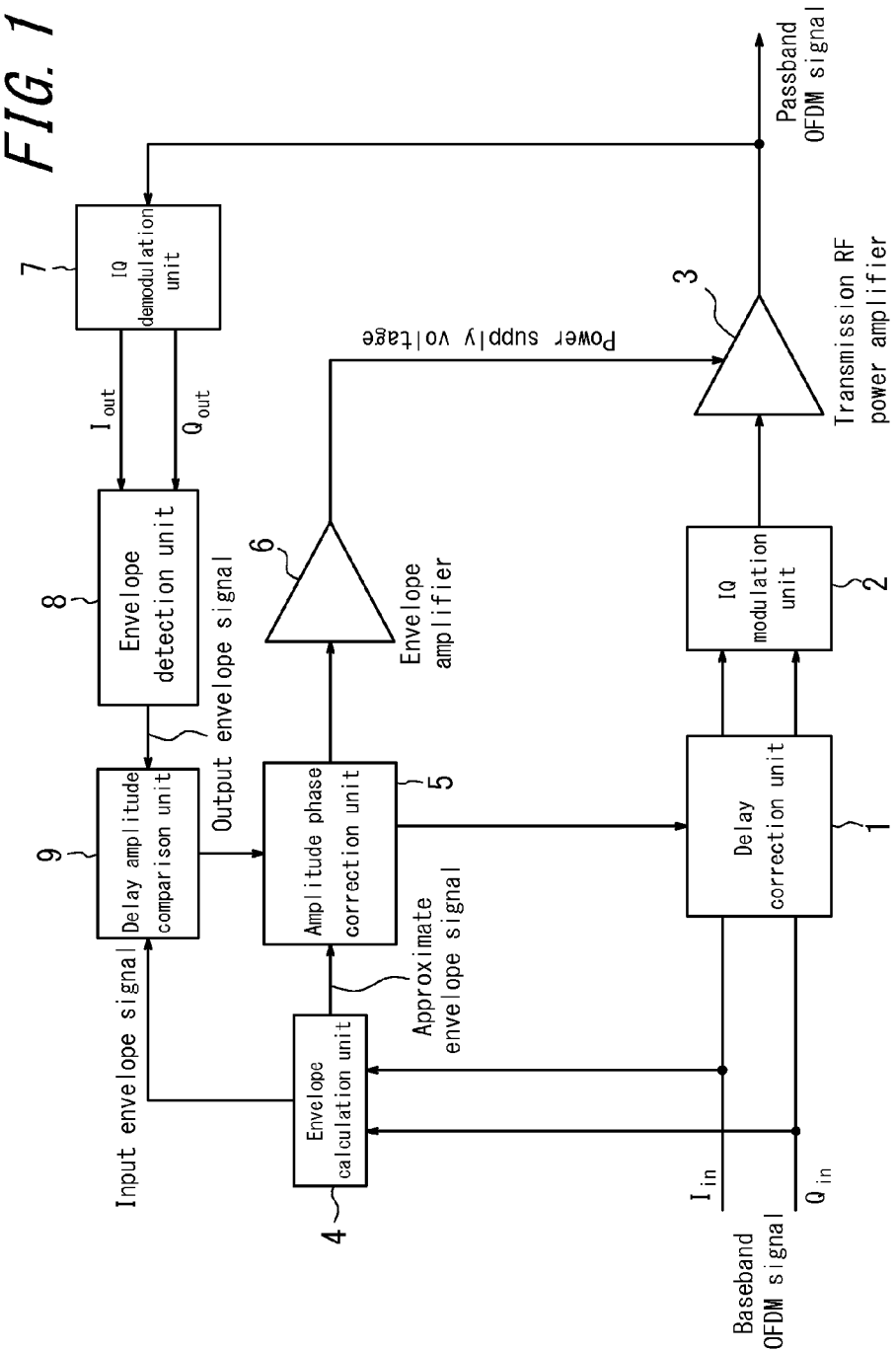
FIG. 1 schematically illustrates the circuit configuration of a transmitter according to an embodiment of the present invention.

FIG. 1 schematically illustrates the circuit configuration of a transmitter according to an embodiment of the present invention. For example, the transmitter according to the present embodiment outputs an OFDM signal and is a radio communication terminal, such as a cellular phone, or a mobile communication base station. The transmitter is provided with a delay correction unit 1, an IQ modulation unit 2, a transmission RF power amplifier 3 (transmission amplifier), an envelope calculation unit 4, an amplitude phase correction unit 5, an envelope amplifier 6 (voltage control amplifier), an IQ demodulation unit 7, an envelope detection unit 8, and a delay amplitude comparison unit 9.

A baseband OFDM signal, which is an input signal, undergoes delay correction (details provided below) in the delay correction unit 1, then undergoes IQ modulation in the IQ modulation unit 2, being output by the transmission RF power amplifier 3 as a passband OFDM signal.

Figure 2:
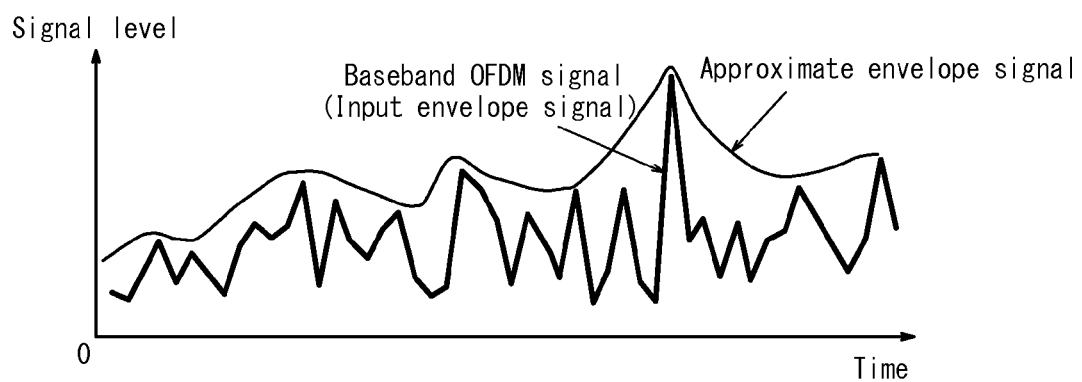
FIG. 2 illustrates an outline of an approximate envelope signal.

From the baseband OFDM signal, which is the input signal, the envelope calculation unit 4 acquires an amplitude signal (envelope signal of the input signal). The envelope calculation unit 4 acquires a detailed envelope signal of the baseband OFDM signal (referred to below as an "input envelope signal") and an approximation of the envelope signal having a lower sampling frequency than the baseband OFDM signal (referred to below as an "approximate envelope signal"). FIG. 2 illustrates the relationship between the baseband OFDM signal and the approximate envelope signal. As illustrated in FIG. 2, the approximate envelope signal has a smoother waveform than the baseband OFDM signal. Note that the input envelope signal has an envelope for each sample of the baseband OFDM signal. The envelope calculation unit 4 aligns the phase of the input envelope signal and the approximate envelope signal, provides the input envelope signal to the delay amplitude comparison unit 9, and provides the approximate envelope signal to the amplitude phase correction unit 5.

Figure 3:
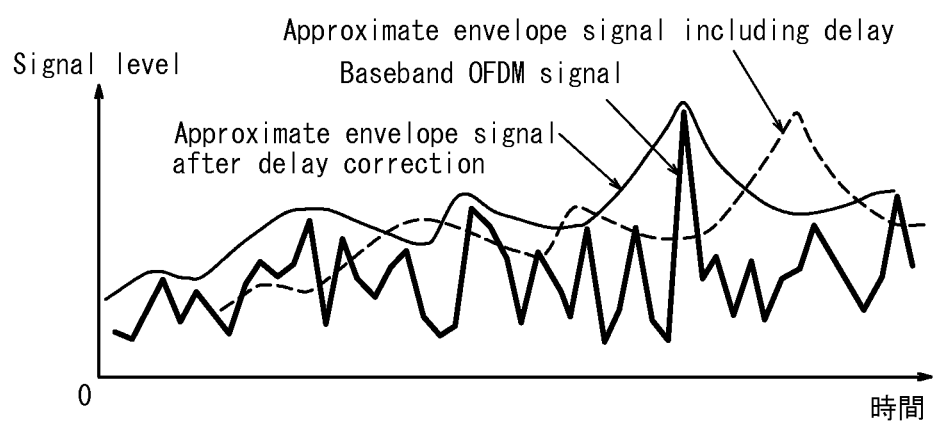
FIG. 3 illustrates an outline of delay correction of an approximate envelope signal.

Since the envelope calculation unit 4 creates the envelope signal after reading approximately 10 samples of the baseband OFDM signal, a delay occurs between the baseband OFDM signal and the envelope signal due to calculation processing. FIG. 3 illustrates the delay between the baseband OFDM signal and the approximate envelope signal. When a delay occurs between the baseband OFDM signal and the envelope signal (in particular the approximate envelope signal), unless the delay is resolved, a similar delay will occur between the input signal and the power supply voltage in the transmission RF power amplifier 3, resulting in reduced efficiency of the transmission RF power amplifier 3. The following is a detailed description of processing by the transmission RF power amplifier 3 to align the phase of the input signal and the power supply voltage.

The IQ demodulation unit 7 performs IQ demodulation on the passband OFDM signal output by the transmission RF power amplifier 3 and provides the demodulated IQ signal to the envelope detection unit 8. The envelope detection unit 8 detects the envelope signal (output envelope signal) of the IQ signal provided by the IQ demodulation unit 7. The envelope detection unit 8 provides the detected output envelope signal to the delay amplitude comparison unit 9.

The delay amplitude comparison unit 9 compares the amplitude and phase of the input envelope signal from the envelope calculation unit 4 and of the output envelope signal from the envelope detection unit 8 to calculate an amplitude ratio and a delay between the two envelope signals. As described above, since the envelope calculation unit 4 synchronizes the input envelope signal and the approximate envelope signal, the delay amplitude comparison unit 9 substantially calculates the delay between the approximate envelope signal and the output envelope signal. The delay amplitude comparison unit 9 provides the calculated amplitude and delay information to the amplitude phase correction unit 5. The amplitude phase correction unit 5 is a unit performing processing to control the power supply voltage amplitude and to align the phase with the input signal in the transmission RF power amplifier 3. First, the amplitude phase correction unit 5 corrects the amplitude and delay (phase) of the approximate envelope signal with the amplitude and delay information from the delay amplitude comparison unit 9, providing the result to the envelope amplifier 6. The amplitude phase correction unit 5 also provides delay information to the delay correction unit 1 for the delay correction unit 1 to synchronize the input signal with the approximate envelope signal. Since the delay correction unit 1 delays the input baseband OFDM signal based on the amplitude and delay information from the amplitude phase correction unit 5 and outputs the result to the IQ modulation unit 2, it is possible in the transmission RF power amplifier 3 to synchronize the phase of the power supply voltage and the input signal.

Figure 4:
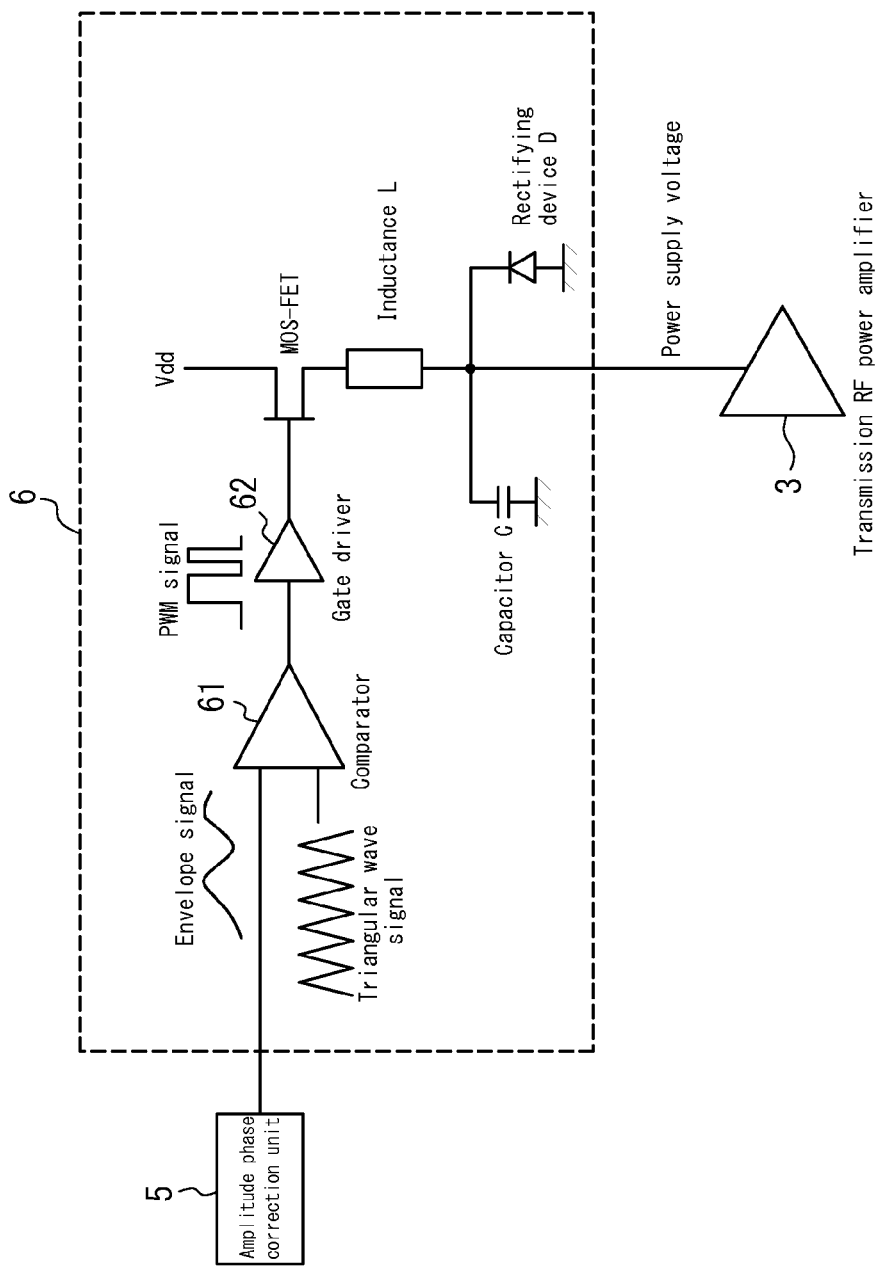
FIG. 4 schematically illustrates the circuit configuration of the envelope amplifier in FIG. 1.

Based on the approximate envelope signal from the amplitude phase correction unit 5, the envelope amplifier 6 controls the power supply voltage applied to the transmission RF power amplifier 3 so that the transmission RF power amplifier 3 operates in the saturation region. FIG. 4 illustrates the configuration of the envelope amplifier 6. The envelope amplifier 6 is provided with a comparator 61, a gate driver 62, a MOS-FET, an inductance L, a capacitor C, and a rectifying device D. The comparator 61 creates a PWM signal by comparing the approximate envelope signal, which is an envelope signal, with a triangular wave signal. The gate driver 62 switches the MOS-FET based on the PWM signal. The switched $V_{dd}$ voltage is smoothed by the inductance L, capacitor C, and rectifying device D and becomes the power supply voltage output to the transmission RF power amplifier 3. In order to reproduce the waveform of the approximate envelope signal with the PWM signal, the frequency of the triangular wave signal is set to roughly 10 times the frequency component of the approximate envelope signal. The values of the inductance L and the capacitor C are set to appropriate values so that the waveform of the approximate envelope signal can be reproduced at the frequency of the PWM signal.

Figure 5:
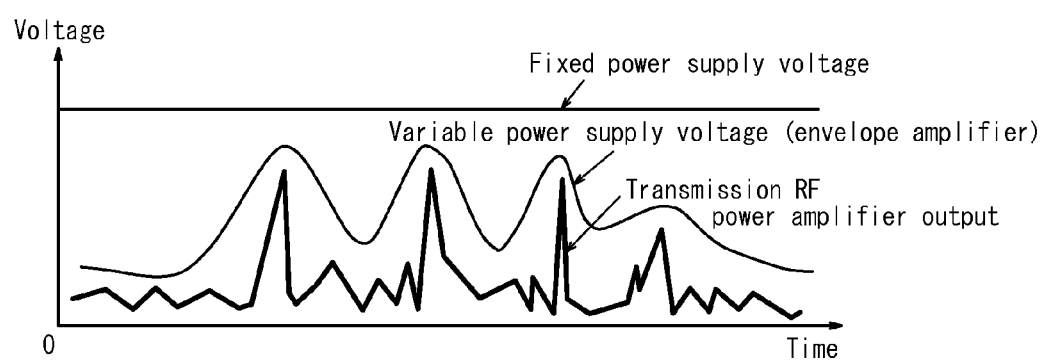
FIG. 5 illustrates an outline of the power supply voltage output by the envelope amplifier.

FIG. 5 illustrates an outline of the power supply voltage output by the envelope amplifier 6. Based on the approximate envelope signal, the power supply voltage output by the envelope amplifier 6 varies dynamically in synchronization with the output signal of the transmission RF power amplifier 3. Therefore, as shown by Equation 1, the efficiency of the transmission RF power amplifier 3 can be enhanced as compared to a fixed power supply voltage.

Figure 6:
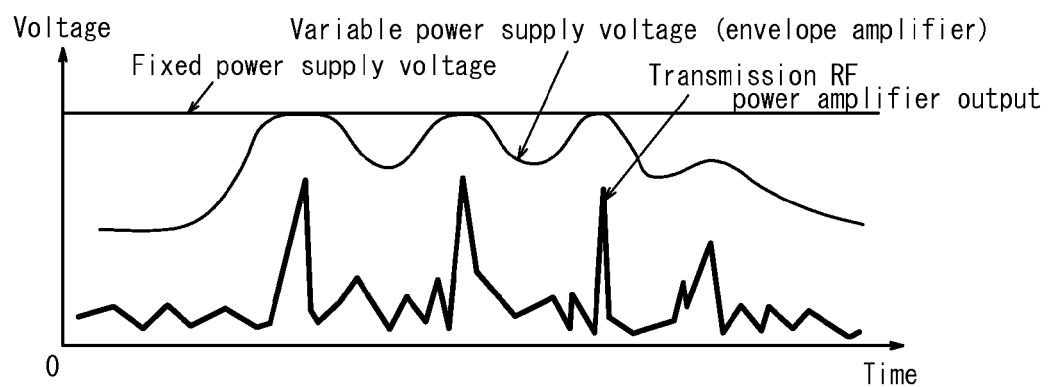
FIG. 6 illustrates an example of a clamp for the power supply voltage output by the envelope amplifier.
Figure 7:
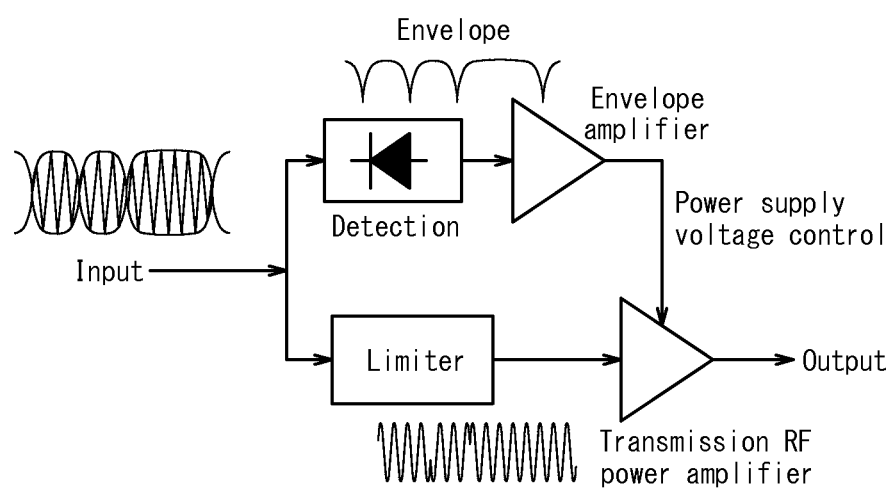
FIG. 7 schematically illustrates the circuit configuration of an analog ET amplifier circuit.
Figure 8:
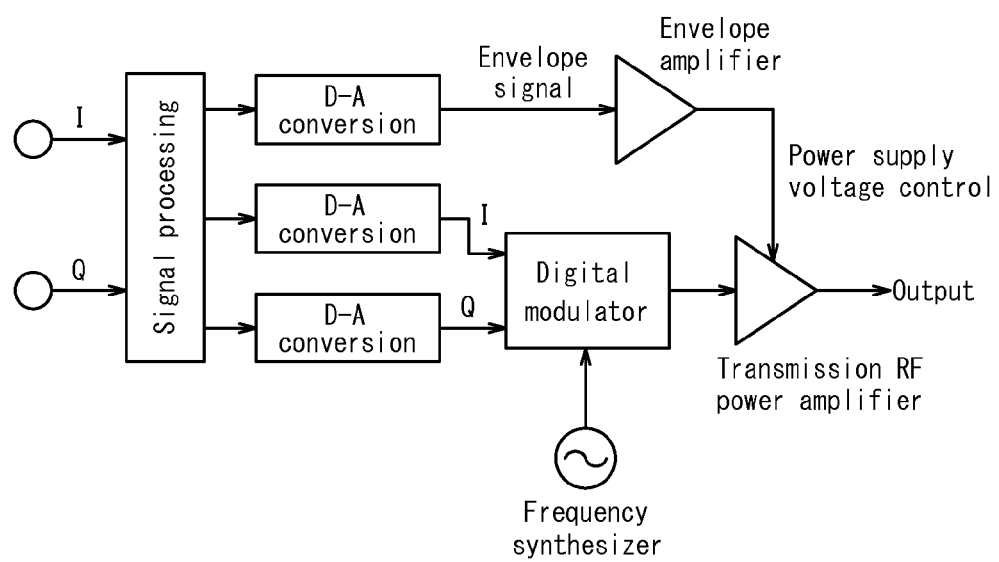
FIG. 8 schematically illustrates the circuit configuration of a digital ET amplifier circuit.
Figure 9:
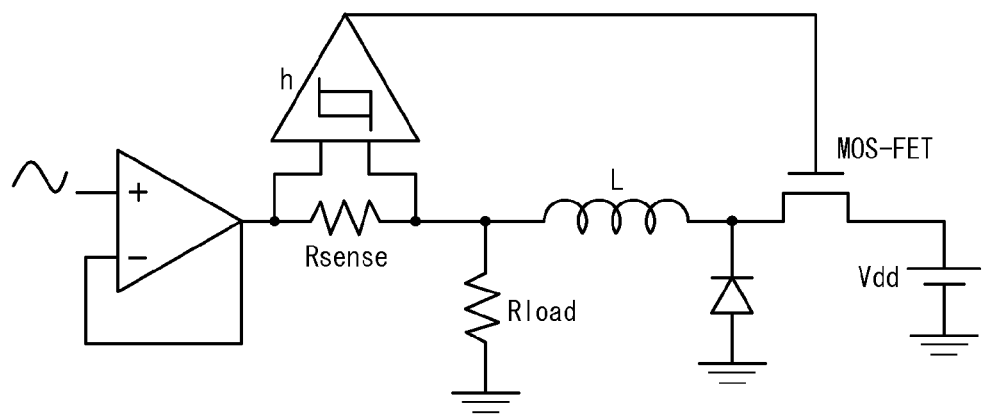
FIG. 9 schematically illustrates the circuit configuration of an envelope amplifier.

FIG. 6 illustrates a special state of FIG. 5, showing the case of the power supply voltage output by the envelope amplifier 6 being clamped. In this case, the envelope amplifier 6 controls the output power supply voltage to be equal to or less than a fixed power supply voltage. In this case, the envelope calculation unit 4 can create an approximate envelope signal taking the clamp into consideration. For example, the envelope calculation unit 4 preferably extends the approximate envelope signal near a peak. The envelope amplifier 6 can therefore appropriately convert the peak of the approximate envelope signal when converting the approximate envelope signal to a PWM signal and outputting the power supply voltage. In this case, as illustrated in FIG. 6, the power supply voltage output by the envelope amplifier 6 has a waveform that is wider and smoother near the peaks than in FIG. 5.

In this way, according to the present embodiment, the envelope calculation unit 4 calculates an approximate envelope signal that is an envelope signal of the input signal and is sampled at a lower frequency than the input signal. The delay correction unit 1 performs delay correction on the input signal so that the input signal and the approximate envelope signal are aligned in phase and provides the input signal after the delay correction to the transmission RF power amplifier 3. The envelope amplifier 6 controls the power supply voltage of the transmission RF power amplifier 3 based on the approximate envelope signal. As a result, the efficiency of the transmission RF power amplifier 3 can be improved, and the switching frequency in the envelope amplifier 6 can be set below that of the transmission RF signal. The choice of switching devices can therefore be widened, and the power consumption for switching can be reduced.

The delay amplitude comparison unit 9 calculates an amplitude ratio and a delay between the output envelope signal and the input approximate envelope signal. Based on the amplitude ratio and the delay, the amplitude phase correction unit 5 corrects the amplitude ratio and the phase of the approximate envelope signal. The delay correction unit 1 performs the delay correction using the delay. As a result, a highly accurate amplitude ratio and delay can be calculated from the comparison between the envelope of the input signal (input envelope signal) and the envelope of the output signal (output envelope signal). The power supply voltage in the transmission RF power amplifier 3 can thus be controlled, the phase of the input signal and of the power supply voltage can be synchronized, and the efficiency of the transmission RF power amplifier 3 can be enhanced.

Although the present invention has been described by way of drawings and an embodiment, it is to be noted that various changes and modifications will be apparent to those skilled in the art based on the present disclosure. Therefore, such changes and modifications are to be understood as included within the scope of the present invention. For example, the functions and the like included in the various units, steps, and the like may be reordered in any logically consistent way. Furthermore, units, steps, and the like may be combined into one or divided.

For example, in the above embodiment, the delay correction unit 1 calculates the delay information for performing the delay correction of the baseband OFDM signal by a comparison between the envelope of the input signal (input envelope signal) and the envelope of the output signal (output envelope signal). Instead of acquiring such feedback-like delay information, delay information calculated based on the calculation time required by the envelope calculation unit 4, for example, may be set in advance in the delay correction unit. Furthermore, a structure may be adopted in which the envelope calculation unit 4 measures the delay dynamically by calculation processing and transmits delay information continuously to the delay correction unit 1.

REFERENCE SIGNS LIST

1: Delay correction unit
2: IQ modulation unit

3: Transmission RF power amplifier (transmission amplifier)
4: Envelope calculation unit
5: Amplitude phase correction unit
6: Envelope amplifier (voltage control amplifier)
61: Comparator
62: Gate driver
7: IQ demodulation unit
8: Envelope detection unit
9: Delay amplitude comparison unit

The invention claimed is:

1. A transmitter comprising:
a transmission amplifier configured to amplify an input signal and generate an output signal;
a voltage control amplifier configured to control a power supply voltage of the transmission amplifier; and
an envelope calculation unit configured to calculate an approximate envelope signal that is an envelope signal of the input signal and is sampled at a lower frequency than the input signal, wherein
the voltage control amplifier controls the power supply voltage of the transmission amplifier based on the approximate envelope signal, wherein a switching frequency in the voltage control amplifier is set below that of the input signal, and wherein the approximate envelope signal is phase aligned with the envelope signal of the input signal.

2. The transmitter according to claim 1, further comprising a delay correction unit configured to perform delay correction on the input signal so that the input signal and the approximate envelope signal are aligned in phase and to provide the input signal after the delay correction to the transmission amplifier.

3. A transmitter comprising:
a transmission amplifier configured to amplify an input signal and generate an output signal;
a voltage control amplifier configured to control a power supply voltage of the transmission amplifier;
an envelope calculation unit configured to calculate an approximate envelope signal that is an envelope signal of the input signal and is sampled at a lower frequency than the input signal;
a delay correction unit configured to perform delay correction on the input signal so that the input signal and the approximate envelope signal are aligned in phase and to provide the input signal after the delay correction to the transmission amplifier;
an envelope detection unit configured to detect an output envelope signal of the output signal from the transmission amplifier;
a delay amplitude comparison unit configured to perform an amplitude and phase comparison between the output envelope signal and the approximate envelope signal; and
an amplitude phase correction unit configured to correct, based on the amplitude and phase comparison, amplitude and phase of the approximate envelope signal so that the input signal and the power supply voltage are aligned in phase in the transmission amplifier and to provide the delay to the delay amplitude comparison unit, wherein
the voltage control amplifier controls the power supply voltage of the transmission amplifier based on the approximate envelope signal, and
the delay correction unit performs the delay correction on the input signal using the delay provided by the amplitude phase correction unit.

4. A signal processing method for a transmitter, comprising:
amplifying an input signal and generating an output signal with a transmission amplifier;
controlling a power supply voltage of the transmission amplifier with a voltage control amplifier;
calculating an approximate envelope signal with an envelope calculation unit, the approximate envelope signal being an envelope signal of the input signal and being sampled at a lower frequency than the input signal;
performing, with a delay correction unit, delay correction on the input signal so that the input signal and the approximate envelope signal are aligned in phase and providing the input signal after the delay correction to the transmission amplifier; and
controlling the power supply voltage of the transmission amplifier with the voltage control amplifier based on the approximate envelope signal, wherein a switching frequency in the voltage control amplifier is set below that of the input signal, and wherein the approximate envelope signal is phase aligned with the envelope signal of the input signal.

5. A signal processing method comprising:
amplifying an input signal and generating an output signal with a transmission amplifier;
controlling a power supply voltage of the transmission amplifier with a voltage control amplifier;
calculating an approximate envelope signal with an envelope calculation unit, the approximate envelope signal being an envelope signal of the input signal and being sampled at a lower frequency than the input signal;
performing, with a delay correction unit, delay correction on the input signal so that the input signal and the approximate envelope signal are aligned in phase and providing the input signal after the delay correction to the transmission amplifier;
controlling the power supply voltage of the transmission amplifier with the voltage control amplifier based on the approximate envelope signal;
detecting an output envelope signal of the output signal from the transmission amplifier with an envelope detection unit;
performing an amplitude and phase comparison between the output envelope signal and the approximate envelope signal with a delay amplitude comparison unit;
calculating a delay from the phase comparison;
correcting, with an amplitude phase correction unit, amplitude and phase of the approximate envelope signal based on the delay so that the input signal and the power supply voltage are aligned in phase in the transmission amplifier and providing the delay to the delay amplitude comparison unit; and
performing, with the delay correction unit, the delay correction on the input signal using the delay provided by the amplitude phase correction unit.

* * * * *